MINIATURIZED CONSTANT TIME DELAY CIRCUIT

Filed May 20, 1965

WITNESSES:
John L. Chopp
James F. Young

INVENTOR
William W. Billings
BY E. F. Possessky
ATTORNEY 3,365,586

MINIATURIZED CONSTANT TIME DELAY CIRCUIT

William W. Billings, Lima, Ohio, assignor to Westinghouse Electric Corporation, Pittsburgh, Pa., a corporation of Pennsylvania Filed May 20, 1965, Ser. No. 457,445
4 Claims. (Cl. 307—235)

ABSTRACT OF THE DISCLOSURE

A time delay circuit utilizing a field effect transistor constant current circuit to charge a capacitor at a constant rate when an input signal is applied and a miniaturized voltage detector to provide an output signal when the capacitor voltage reaches a predetermined value.

The present invention relates to time delay circuits, and more particularly to time delay circuits which are especially susceptible to miniaturization and which are characterized with substantially constant time delay notwithstanding variations in operating temperaturre and voltage.

Time delay circuits have utility in a wide variety of control and other electronic circuitry. Typically, a time delay circuit is used when it is desired that a voltage level appearing at one circuit location be indicated at another circuit location only if the voltage persists for the predetermined time delay period. Aircraft and various other similar systems form one field of application, and in these systems certain conditions external to the time delay circuit are susceptible to variation and proper system functioning makes it desirable or necessary that substantially constant time delay be produced regardless of fluctuations in the external parameters. System design considerations also make it desirable that any time delay circuit which does operate with accuracy should be susceptible to miniaturization.

To produce voltage time delay, a time delay circuit arrangement usually comprises a timing circuit and a voltage detector which generates an output signal at some time after an input signal is applied to the timing circuit. One variable parameter which can lead to time delay error is the operating or supply voltage for the timing circuit. Avoidance of time delay error due to supply voltage variation often is realized by regulating the supply voltage, but at best the regulation usually requires the use of a Zener diode or a similar voltage limiting device. Temperature is another variable parameter which can affect the accuracy of the time delay period, and various time delay circuit schemes have been used which offset the effects of variable temperature to one degree or another.

In accordance with the principles of the present invention, a time delay circuit arrangement comprises a timing circuit and a voltage detector which can be combined together in a miniature package to produce accurate time delay. The timing circuit preferably comprises a timing capacitor energized directly from a signal input terminal through a constant current generator to eliminate economically error effects from operating or supply voltage variation. Differential transistor amplifier means and high gain complementary transistor amplifier means are cooperatively combined in the voltage detector to respond to the timing circuit and produce the time delayed output substantially without temperature induced time delay error.

It is, therefore, an object of the invention to provide a novel time delay circuit which operates with a high degree of accuracy and reliability.

Another object of the invention is to provide a novel time delay circuit including a voltage detector which can be readily miniaturized for packaging in a relatively small volume.

A further object of the invention is to provide a novel time delay circuit which operates substantially free of time delay error induced by variations in timing circuit operating voltage.

It is another object of the invention to provide a novel time delay circuit which operates substantially free of temperature induced time delay error.

It is an additional object of the invention to provide a novel time delay circuit in which timed voltage is efficiently detected without the use of sharp knee Zener diodes or the like.

It is a further object of the invention to provide a novel time delay circuit in which comparatively lower RC product and therefore lower capacitor size is required to achieve a given time delay period.

Another object of the invention is to provide a novel voltage detector which accurately and sensitively detects input voltage level and which produces full output voltage for all input voltages of magnitude equal or greater than a reference voltage level.

These and other objects of the invention will become more apparent upon consideration of the following detailed description along with the attached drawings, in which.

Figure 1:
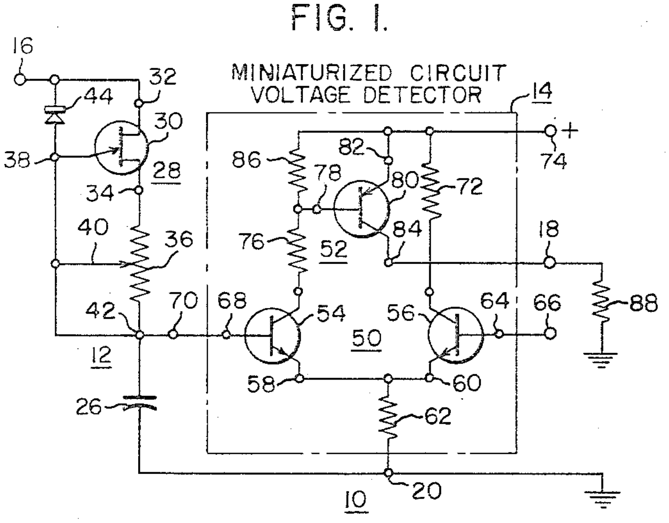
FIGURE 1 is a schematic diagram of a time delay circuit arranged in accordance with the principles of the invention.
Figure 2:
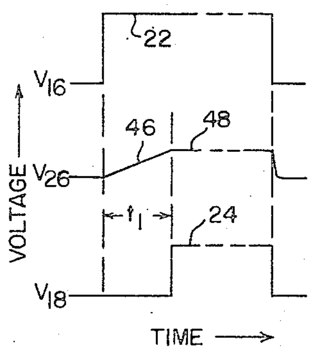
FIG. 2 shows certain voltage waveforms applicable to the circuit of FIG. 1.

More specifically, there is shown in FIG. 1 a time delay circuit 10 arranged in accordance with the principles of the invention and having a timing circuit 12 and a voltage detector 14 connected between an input terminal 16 and an output terminal 18, with a common or ground terminal 20. An input voltage signal 22 (FIG. 2) is applied between the input and common terminals 16 and 20, and an output voltage signal 24 is generated across the output terminal 18 and the common terminal 20 with predetermined time delay $t_1$.

The timing circuit 12 includes a timing capacitor 26 energized by a constant current generator 28 which is connected between the timing capacitor 26 and the input terminal 16. Constant current generation is achieved in this instance by means of a field effect transistor 30 having a drain terminal 32 and a source 34 connected in series with a potentiometer 36 or other suitable variable resistance means. A gate terminal 38 of the field effect transistor 30 is directly connected to a tap arm 40 of the potentiometer 36 and to the timing capacitor 26 at junction 42 so as to maintain the P-N junction in the field effect transistor 30 in a state of reverse bias and thereby operate the transistor 30 along the constant current portion of its characteristic voltage-current curve. In effect, any change in the current flowing through the transistor 30 and the potentiometer 36 changes the bias on the gate 38 of the transistor in a manner to keep the current constant.

In order to provide for discharge of the timing capacitor 26 after the input voltage signal 22 has been withdrawn from the input terminal 16, a diode 44 is connected between the field effect transistor gate terminal 38 and the input terminal 16. The diode 44 is connected for forward current conduction from the timing capacitor 26 to the input terminal 16 and thruogh input circuitry (not shown) such as a coupling resistor to ground.

The potentiometer 36 is set to produce the desired charging current for the timing capacitor 26 and hence the time period $t_1$ required for voltage 46 (FIG. 2) across the timing capacitor 26 to reach a reference voltage level 48. The potentiometer 36 functions as a timing resistor since its setting determines the charging rate of the capacitor 26 and thus determines the time delay period. With the employment of the constant current generator 28 in the timing circuit 12, a comparatively low RC product is required to produce the time delay period $t_1$. Net savings in packaging volume can thus be realized through the use of smaller capacity units for the timing capacitor 26. Further, relatively wide variations in the input voltage 22 (which operates the timing circuit 12) have no effect on the length of the time delay period $t_1$ because of the constancy of current generation by the current generator 28.

The voltage detector 14 provides the reference voltage level 48 and detects the point in time at which the timing capacitor 26 is charged to that voltage. The voltage detection is indicated by a highly amplified or digitalized voltage output at the detector terminals 18 and 20. Preferably, the voltage detector 14 is a miniaturized device in the form of a thin-film unit, or if desired, in the form of a solid state molecular unit.

If the voltage detector 14 is formed as a thin-film unit, existing knowledge in the thin-film art is employed to form the various voltage detector components and connections on a substrate formed from ceramic or other suitable material. When so formed, the voltage detector 14 can be packaged in a conventional transistor case having terminal pins at the base thereof and having a diameter as small as three-eighths of an inch or less. When the voltage detector 14 is formed as a solid state molecular device, a configuration of P and N regions and PN junctions is employed to form the detector components.

The voltage detector 14 can also be formed by conventional components where miniaturization is not a critical consideration. Since the detector 14 can be provided in a variety of forms, the use of the term "voltage detector" or "voltage detector circuit means" herein is meant to refer generically to the various forms in which the detector 14 can possibly be embodied.

Characteristically, the voltage detector 14 is a Darlington output differential amplifier type voltage detector since it comprises a differential amplifier 50 and a high gain complementary type amplifier 52 commonly referred to as a Darlington amplifier. The amplifier combination is advantageously employed with the time delay circuit 10 for the purpose of voltage detection since it operates with temperature stability and is relatively sensitive to input voltage to produce a high gain voltage output.

To provide the reference voltage level 48 with temperature stability, the differential amplifier 50 comprises a pair of NPN type transistors 54 and 56 having emitter regions 58 and 60 commonly connected through a common emitter resistor 62 to the common circuit terminal 20. A base region 64 of the transistor 56 is connected through a detector device terminal 66 to a fixed reference voltage available in the system in which the time delay circuit 10 is employed. The transistor 54 has a base region 68 connected to a detector device input terminal 70, and voltage of the timing capacitor 46 is applied across the base-emitter circuit of the transistor 54 through the detector input terminal 70 and the common terminal 20. A collector resistor 72 is connected in the collector-emitter path of the transistor 56 to a power supply terminal 74 of the detector 14. A collector resistor 76 is also connected in the collector-emitter path of the transistor 54 but it is connected to the power supply terminal 74 through the high gain amplifier 52.

Prior to the application of the input voltage 22, the reference voltage applied to the reference voltage terminal 66 produces a forward base-emitter bias so that the transistor 56 is normally conducting. Current through the transistor 56 causes a voltage drop across the common emitter resistor 62 to bias the base-emitter P-N junction of the transistor 54 in the reverse direction.

When the input voltage 22 is applied and the capacitor voltage 46 rises sufficiently to offset the reverse bias produced by the voltage drop across the emitter resistor 62 (i.e., when it reaches the reference voltage level 48), the base-emitter P-N junction of the transistor 54 becomes forward biased and the transistor 54 is switched to a conductive state. Current through the common emitter resistor 62 is then sufficient to produce a reverse emitter-base bias on the transistor 56 and thereby switch the transistor 56 to an off condition. The time delay period $t_1$ remains substantially constant with operating temperature variation since thermal stability is an inherent characteristic of the timing circuit 12 and the differential amplifier 50.

The transistor 54 is common to the differential amplifier 50 and the high gain amplifier 52 and it is thus coupled to a base region 78 of another transistor 80 in the amplifier 52 by means of the collector resistor 76. The transistor 80 is the complementary type, i.e., in this instance it is a PNP type, and the amplifier 52 is thus characterized as a high gain complementary type amplifier. An emitter region 82 of the transistor 80 is connected to the DC supply terminal 74 and a collector region 84 is connected to the output terminal 18. A leakage resistor 86 is connected between the base and emitter regions 78 and 82 so as to provide for flow of leakage collector current when the transistor 80 is in an off condition.

Since the base-emitter path of the transistor 80 is in series with the collector-emitter path of the transistor 54, the base of the transistor 80 becomes saturated and the base-emitter PN junction becomes forward biased when the transistor 54 is caused to conduct when the capacitor voltage 46 reaches the reference voltage level 48. The transistor 80 is switched on and collector current flows from the DC supply terminal 74 to the output terminal 18 and through an output load resistor 88 to ground. Thus, the transistor 80 produces no output when the transistor 54 is off, and it produces a high gain output at the supply voltage level when it is turned on to indicate accurately the time point at which the capacitor voltage 46 reaches the reference voltage level 48.

Efficient and accurate voltage detection is provided by the voltage detector 14 and it accordingly can be generally used for overvoltage or undervoltage detection or other purposes and in such use it can be readily miniaturized to provide packaging advantages. In the time delay circuit 10, the detector 14 is cooperatively combined with the timing circuit 12 to provide voltage time delay which remains substantially constant at any setting of the potentiometer 40 notwithstanding variations in detector operating temperature and timing circuit operating voltage. Overall benefits in reduced packaging volume are realized by the reduced capacitor size enabled in the timing circuit 12 and by miniaturization of the voltage detector 14.

Figure 3:
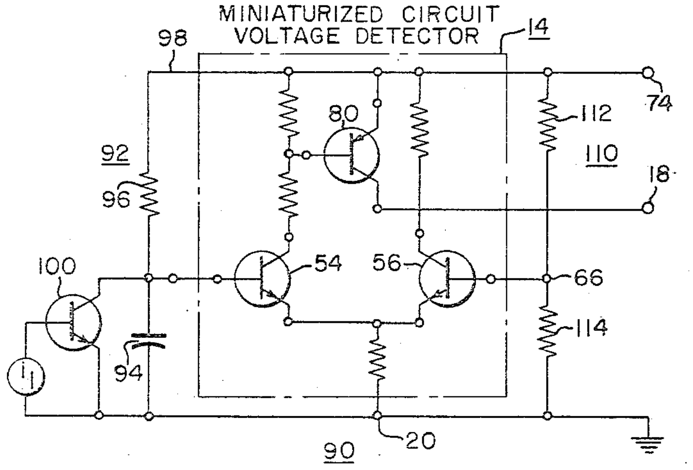
FIG. 3 shows a schematic diagram of another circuit arranged in accordance with the principles of the invention.

In FIG. 3 there is shown another embodiment of the invention in the form of a time delay circuit 90 which is similar to the time delay circuit 10 and therefore like reference characters have been employed for like elements. The time delay circuit 90 differs from the time delay circuit 10 primarily through the provision of a conventional time delay circuit 92 which includes a timing capacitor 94 and a resistor 96 connected in a series circuit 98 between the DC supply terminal 74 and the common terminal 20.

A semiconductor switch or transistor 100 is connected across the timing capacitor 94 to control the application of charging current to the timing capacitor 94.

Figure 4:
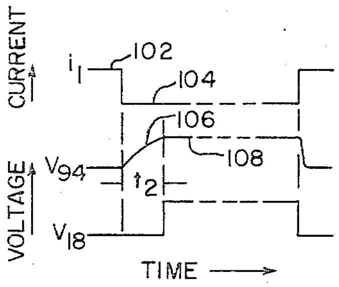
FIG. 4 shows certain current and voltage waveforms applicable to the circuit of FIG. 3.

When input signal current 102 is applied to the transistor base-emitter circuit, the transistor 100 conducts to shunt the timing capacitor 94. After the transistor 100 is turned off, as indicated by the reference character 104 (FIG. 4), the timing capacitor 94 is charged and capacitor voltage rises as indicated by the reference character 106. When the capacitor voltage 106 reaches a reference voltage level 108 after a predetermined time delay period $t_2$, output voltage appears at the voltage detector output terminal 18 in a manner similar to that described in connection with the circuit 10.

In the time delay circuit 90, variations in the potential of the DC supply voltage at the terminal 74 could ordinarily cause the time delay period $t_2$ to vary. Such variance is prevented, however, by the employment of a voltage divider 110 comprising series connected resistors 112 and 114 connected between the DC supply voltage terminal 74 and the common terminal 20. The reference voltage terminal 66 of the voltage detector 14 forms a junction between the resistors 112 and 114.

In this manner, the reference voltage applied to the base-emitter circuit of the transistor 56 varies with variations in the DC supply voltage but it is always a fixed ratio or proportion of the DC supply voltage. Similarly, the time rate of capacitor voltage rise is substantially proportional to the DC supply voltage level. Thus, the time required for the capacitor voltage to reach the reference voltage level, i.e., the time delay period $t_2$, remains substantially constant with variations in the DC supply voltage, since corresponding changes in the reference voltage level are accompanied by exact compensatory changes in the time rate of capacitor voltage rise. The time delay circuit 90 thus operates with advantages similar to those described for the time delay circuit 10.

The foregoing description has been presented only to illustrate the principles of the invention. Accordingly, it is desired that the invention be not limited by the embodiments described, but, rather, that it be accorded an interpretation consistent with the scope and spirit of its broad principles.

What is claimed is:

1. A time delay circuit arrangement comprising a timing circuit having an input terminal for receiving an input signal voltage and a timing capacitor, a timing resistor and a field effect transistor having source and drain terminals connected in a series path between said input terminal and said timing capacitor, said field effect transistor having a gate terminal connected to said capacitor, and voltage detector circuit means energized from a DC supply voltage terminal and coupled to said timing capacitor.

2. The circuit arrangement as set forth in claim 1 wherein a diode is connected between said field effect transistor gate terminal and said input terminal to discharge said timing capacitor when input voltage is removed from said input terminal.

3. A circuit arrangement as defined in claim 1 in which said voltage detector circuit means comprises a differential amplifier circuit having input terminal means coupled to the timing capacitor, reference voltage terminal means adapted to be connected to a reference voltage, and output terminal means, said differential amplifier circuit producing an output signal at the output terminal means when the voltage applied to the input terminal means exceeds the reference voltage.

4. A circuit arrangement as set forth in claim 3 wherein a diode is connected between said field effect transistor gate terminal and said timing circuit input terminal to discharge said timing capacitor when the input voltage is removed from said timing circuit input terminal.

References Cited

UNITED STATES PATENTS

| | | | |
|---|---|---|---|
| 2,939,018 | 5/1960 | Faulkner | 307—88.5 |
| 3,048,708 | 8/1962 | Raver | 307—88.5 |
| 3,049,627 | 8/1962 | Higginbotham | 307—88.5 |
| 3,165,648 | 1/1965 | Sainsbury | 307—88.5 |
| 3,263,093 | 7/1966 | Erdmann | 307—88.5 |

ARTHUR GAUSS, *Primary Examiner.*

J. ZAZWORSKY, *Assistant Examiner.*